United States Patent
Burcham

(10) Patent No.: US 7,196,495 B1
(45) Date of Patent: Mar. 27, 2007

(54) DUAL BATTERY AND MONITOR ARRANGEMENT

(75) Inventor: James Temple Burcham, Richmond, TX (US)

(73) Assignee: Concord Technologies, LP, Houston, TX (US)

( * ) Notice: Subject to any disclaimer, the term of this patent is extended or adjusted under 35 U.S.C. 154(b) by 131 days.

(21) Appl. No.: 10/832,541

(22) Filed: Apr. 27, 2004

(51) Int. Cl.
*H02J 7/00* (2006.01)
*H03F 3/45* (2006.01)

(52) U.S. Cl. .................... 320/134; 327/56

(58) Field of Classification Search ........ 320/DIG. 18, 320/DIG. 19, DIG. 21, 112, 114, 132, 134, 320/135, 127; 327/52, 54, 56
See application file for complete search history.

(56) References Cited

U.S. PATENT DOCUMENTS

| | | | |
|---|---|---|---|
| 4,090,122 A | | 5/1978 | Hoinski |
| 4,155,081 A | | 5/1979 | Haglund |
| 4,876,632 A | * | 10/1989 | Osterhout et al. ... 320/DIG. 21 |
| 4,958,641 A | | 9/1990 | Digby et al. |
| 5,204,610 A | | 4/1993 | Pierson et al. |
| 5,235,979 A | | 8/1993 | Adams |
| 5,372,605 A | | 12/1994 | Adams et al. |
| 5,387,858 A | | 2/1995 | Bender et al. |
| 5,549,984 A | | 8/1996 | Dougherty |
| 5,574,436 A | * | 11/1996 | Sisselman et al. .......... 340/663 |
| 6,229,279 B1 | | 5/2001 | Dierker |
| 6,275,001 B1 | | 8/2001 | Dierker |
| 6,612,886 B2 | * | 9/2003 | Cole, Jr. ..................... 441/133 |
| 6,661,200 B2 | * | 12/2003 | Odaohhara .................. 320/132 |
| 6,784,638 B2 | * | 8/2004 | Yang .......................... 320/119 |

* cited by examiner

*Primary Examiner*—Karl Easthom
*Assistant Examiner*—Richard V. Muralidar
(74) *Attorney, Agent, or Firm*—Gary L. Bush, Esq.; Andrews Kurth LLP

(57) ABSTRACT

A redundant battery power supply with combined battery charge indication which incorporates a main cell, conductively coupled to the supply bus which powers the load when activated, and a predictive cell, coupled to the bus by an optional diode which becomes forward biased when the main cell voltage drops below the predictive cell voltage. If the main cell becomes discharged, the predictive cell powers the bus. Each cell is coupled to a voltage comparator which compares the cell output voltage to a common reference voltage. When a cell voltage drops below the reference voltage, the corresponding comparator output goes low. The output of the two comparators are combined by a logical AND gate which controls a flashing light. When both the main cell and predictive cell have voltages greater than the reference voltage, the light flashes, but when either cell (or both) has a voltage less than the reference voltage, the light does not flash. The power for the flashing light is provided solely by the predictive cell.

23 Claims, 3 Drawing Sheets

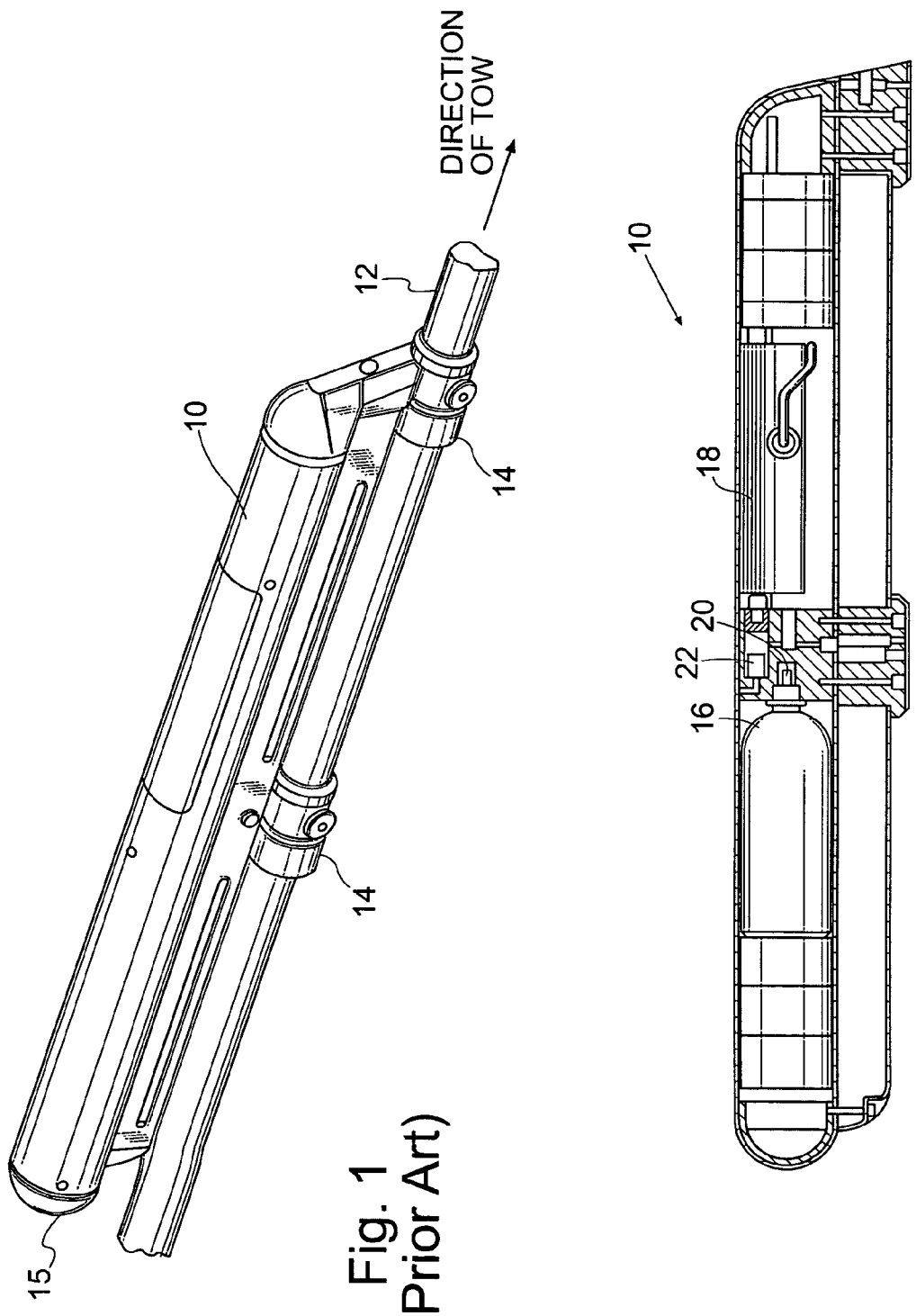

DUAL BATTERY AND MONITOR ARRANGEMENT

BACKGROUND OF THE INVENTION

1. Field of the Invention

This invention relates generally to the application of batteries and battery charge indicators used in powering systems such as, but not limited to, underwater applications such as marine seismic exploration. More specifically, this invention relates to a battery-powered circuit with two batteries, either of which is capable of handling system power requirements, and a circuit that furnishes an external visual indication of battery health for use with towed streamer cable retrievers.

2. Description of the Prior Art

While conducting offshore seismic surveys for oil and gas deposits, it is customary to tow streamer cables, often three to ten kilometers in length, beneath the surface and astern of a ship. As many as twelve of these streamer cables can be towed simultaneously. Each cable contains multiple hydrophones as well as associated electronics and other sensors required in the exploration process and can cost over one million dollars. These streamers are constructed using semi-plastic material or oil-filled plastic tubing. They are typically five to seven centimeters in diameter.

While towing long streamer cables, a number of hazards exist that can cause damage or loss to any overboard equipment. Under-water obstructions, trawlers and extreme sea conditions all pose a threat to the streamer cables. It is important that an automatic floatation and recovery system be employed at all times to keep the entire cable afloat if an accident occurs which causes the cable to sink.

FIG. 1 of the attached drawings shows a prior art system. The safety of a streamer cable (12) relies on a floatation system referred to as a "retriever" (10). Retrievers (10) are attached along the length of the streamer cable (12) at intervals of about three hundred meters. The retrievers are attached to the streamer cables by collars (14) which allow the retriever to freely rotate about the cable. The retriever often has a removable tailpiece (15) for access to internal components. As shown in FIG. 2, each retriever (10) is an independent system that includes a compressed gas canister (16), an inflatable floatation bag (18), an electrically actuated detonator (20) designed to rupture the seal of the gas canister (16) for releasing compressed gas into the flotation bag (18) to inflate it, a pressure switch (22) which senses seawater pressure, and a battery (24) (See FIG. 4) which powers the detonator (20) upon closure of the pressure switch (22).

If the streamer cable sinks to a depth of about forty-eight meters, the pressure switch (22) actuates, thereby directing electric current from the battery (24) to the detonator (20), also known as a squib, which pierces the seal of the gas canister (16). The pressurized gas inflates the floatation bag (18) to provide the buoyancy necessary to lift the cable (12) to the surface for recovery. An actuated retriever is shown in FIG. 3. The gas-filled floatation bag (18) causes the cable (12) to rise to the surface.

Additional background information concerning cable buoyancy is provided in U.S. Pat. No. 5,404,339 issued to Cole, on Apr. 4, 1995, which is incorporated in its entirety herein by reference. Other methods for maintaining buoyancy within a streamer cable have been developed. Examples include: U.S. Pat. No. 6,019,652, entitled Buoyancy Adjustment, issued Feb. 3, 2000 to Neilson, et al.; U.S. Pat. No. 6,142,092, entitled Depth Control Device, issued Nov. 7, 2000 to Copeland; U.S. Pat. No. 6,188,646, entitled Hydrophone Carrier, issued Feb. 13, 2001 to Luscombe, et al.; and U.S. Pat. No. 6,239,363, entitled Variable Buoyancy Cable, issued May 29, 2001 to Wooters.

As illustrated in FIG. 4, prior art retrievers contain only one battery (24) and have no means to monitor the battery charge or "health" by an external inspection. If the battery (24) becomes discharged for any reason prior to retriever activation, a catastrophic loss can occur if the cable sinks. Some prior art retriever designs preferably use a lithium cell for the single battery (24). However, it is difficult to determine the capacity of a given lithium cell using voltage measurements alone. A method which simply allows a user to verify that a battery cell within a sealed enclosure has ample charge to function is desirable. Additionally, a redundant battery source is desirable, because a single battery may pass the most recent visual inspection yet fail while the retriever is in use.

Dual battery circuits are known. For example, U.S. Pat. No. 4,090,122 issued to Hoinski discloses an automotive dual battery system with logic means to determine to which battery the load should be switched. U.S. Pat. No. 5,235,979 issued to Adams and U.S. Pat. No. 5,372,605 issued to Adams et al. each disclose a dual battery system with a monitoring circuit for use in implantable defibrillators. U.S. Pat. No. 5,549,984 issued to Dougherty describes a control and indicator circuit for a dual battery system.

3. Identification of Objects of the Invention

A primary object of the invention is to provide a redundant cell battery power supply with a combined cell health visual indicator which notifies the user that at least one of the two battery cells has been depleted.

Another object of the invention is to provide an external, visual, bright and essentially continuous indication of the condition of the redundant batteries which are sealed in a watertight enclosure.

SUMMARY OF THE INVENTION

The objects identified above, as well as other features and advantages of the invention are embodied in the electrical circuit provided for a redundant battery power supply with combined battery charge indication. The invention incorporates two separate battery cells: a main cell and a predictive cell. The main cell is conductively coupled to the supply bus which powers the load when activated. The predictive cell is optionally coupled to the supply bus by a diode which becomes forward biased when the main cell voltage drops below the predictive cell voltage. Thus, if the main cell becomes discharged, the predictive cell can power the supply bus.

The main cell and the predictive cell are each individually coupled to a voltage comparator which compares the cell output voltage to a common reference voltage. When a cell voltage drops below the reference voltage, the corresponding comparator output goes low. The output of the two comparators are combined by a logical AND gate which controls a flashing light. When both the main cell and predictive cell have voltages greater than the reference voltage, the light flashes, but when either cell (or both) has a voltage less than the reference voltage, the light does not flash. The light is positioned near a window in the retriever so that it may be viewed by a user without opening the retriever.

The power for the flashing light is provided solely by the predictive cell. Thus, if there is no load on the supply bus (i.e. an open circuit), the predictive cell should discharge faster than the main cell. If both the main cell and the predictive cell are identical when placed into the circuit, than the predictive cell will become depleted before the main cell, hence the use of the term "predictive."

BRIEF DESCRIPTION OF THE DRAWINGS

The invention is described in detail hereinafter on the basis of the embodiments represented in the accompanying figures, in which:

FIG. 1 is a perspective view of a prior art cable retriever that is attached to a seismic streamer cable by means of rotating collars;

FIG. 2 is a side view in cross section of the prior art retriever of FIG. 1 showing internal components;

DESCRIPTION OF THE PREFERRED EMBODIMENT OF THE INVENTION

Figure 3:
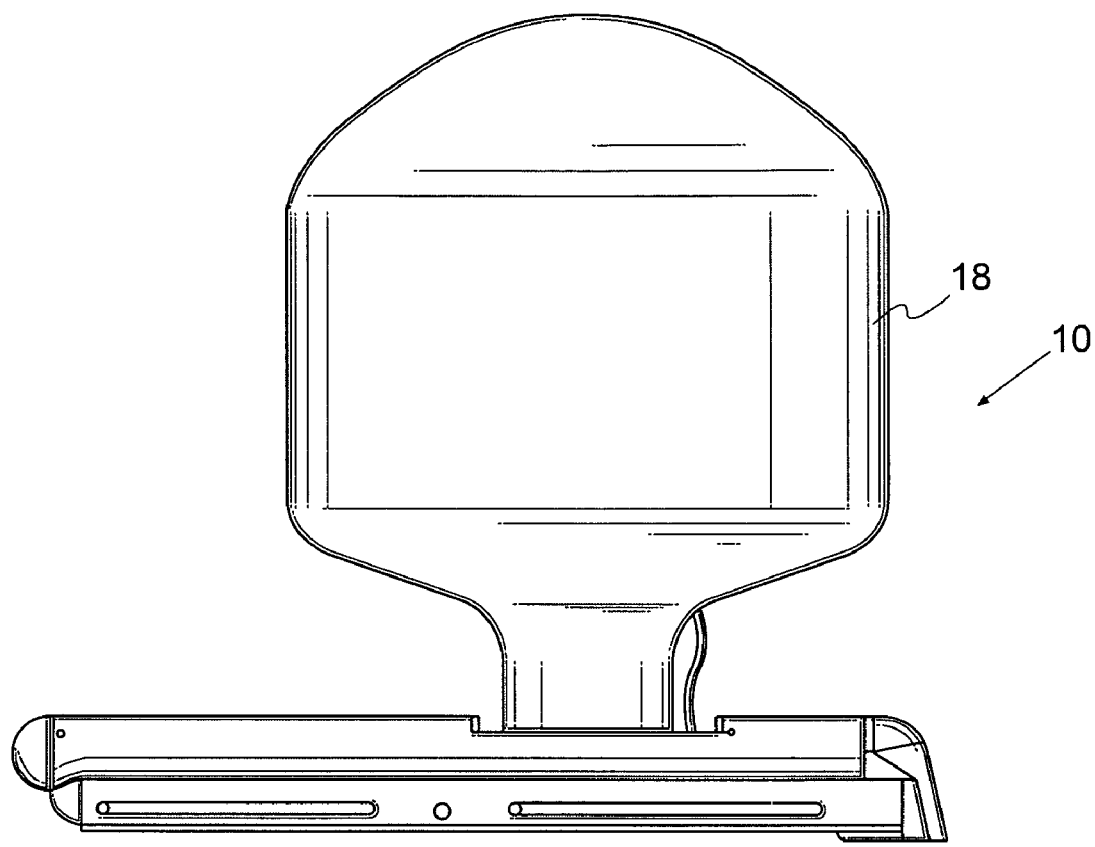
FIG. 3 is a side view of the prior art retriever of FIG. 1 after actuation and with the flotation bag extended out of the retriever housing.
Figure 4:
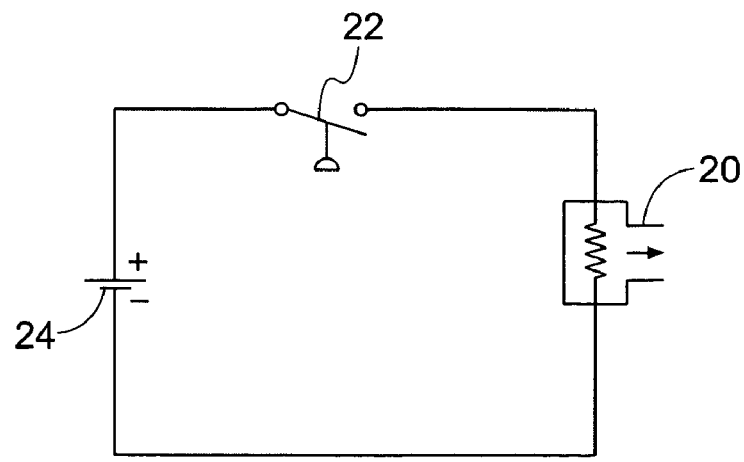
FIG. 4 is a schematic of an actuation circuit of a prior art cable retriever.
Figure 5:
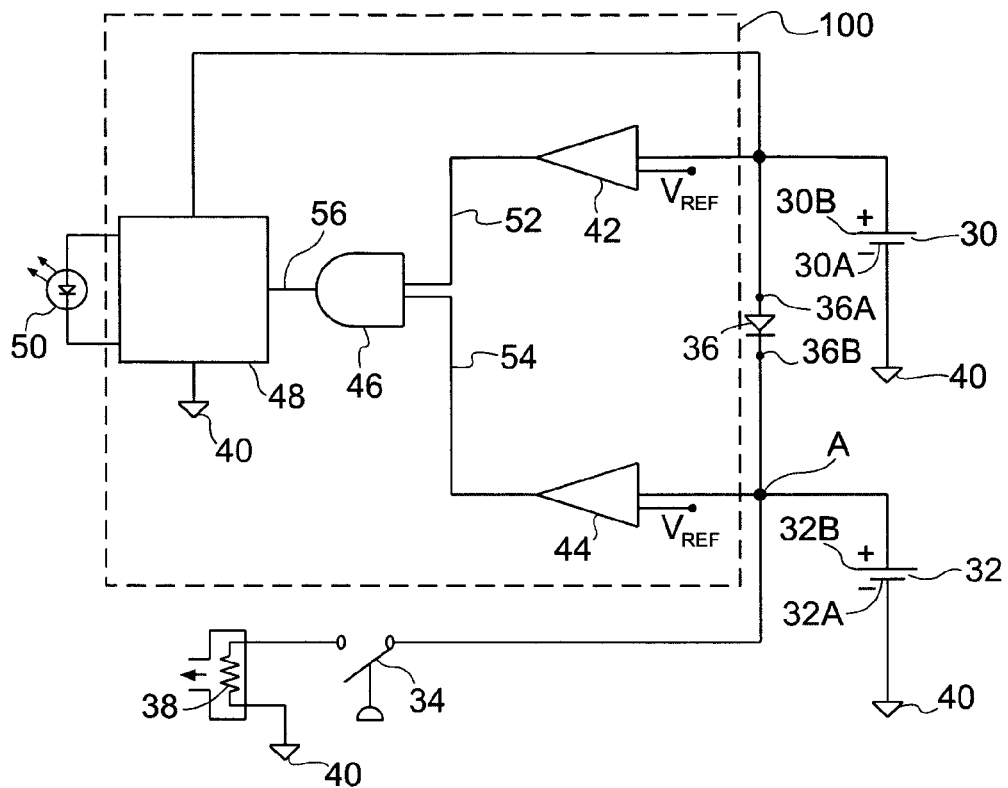
FIG. 5 is a schematic diagram of the dual battery and monitoring electrical circuit according to the present invention.

The preferred embodiment of the dual battery circuit of the invention is illustrated schematically in FIG. 5. The circuit consists of power circuitry and battery monitoring circuitry.

The power circuitry includes a predictive battery 30, a main battery 32, a switch 34, a diode 36, and a load 38. The negative terminals 30A, 32A of batteries 30 and 32 are tied to ground 40. The positive terminals 30B, 32B of batteries 30 and 32 are optionally interconnected for redundancy via a diode 36, with the diode anode 36A connected to the positive terminal of battery 30 and the diode cathode 36B connected to the positive terminal of battery 32. The positive terminal 32B of battery 32 is coupled to the supply bus, indicated at node A. The supply bus A is also conductively connected to a first terminal of load 38 through switch 34. The power circuit is completed by connecting the second terminal of load 38 to ground 40.

The redundant power circuit operates as follows: When diode 36 is forward biased by about 0.7V, it will conduct current. That is, if the voltage with respect to ground of predictive battery 30 is greater than the voltage with respect to ground of main battery 32 by about 0.7V, the diode will conduct current. However, if the diode is not forward biased by about 0.7V, it is said to be in cut-off mode, and no current will flow. Thus, when switch 34 is closed, if the voltage of predictive battery 30 is not greater than the voltage of main battery 32 plus 0.7V, diode 34 blocks current flow, and load 38 is powered solely by main battery 32. However, once the voltage of main battery 32 drops below the voltage of predictive battery 30 by about 0.7V, diode 36 will begin to conduct current, and the power to load 38 is supplied by a proportional combination of the two batteries 30 and 32, depending on the respective terminal voltages of the batteries. The weaker main battery 32 becomes compared to predictive battery 30, the greater the portion of the total load power is supplied by predictive battery 30.

The circuit may be used without the diode 36. In this case, the load on bus A is powered solely by the main battery 32 regardless of the voltage of the main battery 32 or the voltage of the predictive battery 30. The predictive cell 30 simply exists in this configuration to predict impending failure of main battery 32, by discharging faster than the main battery as discussed below.

The battery health monitoring circuitry 100 includes two voltage comparators 42, 44, an AND logic gate 46, a flashing circuit 48, and a light-emitting diode (LED) 50. The positive terminal 30B of predictive battery 30 is connected to an input of comparator 42, and main battery 32 is likewise connected to another comparator 44. Comparators 42 and 44 are identical devices. Each comparator receives power from the battery to which it is connected. The voltage comparators are three-terminal devices which compare an input voltage to a reference voltage $V_{REF}$. The comparators produce at their output a high logic voltage if the input voltage is greater than $V_{REF}$ and a low logic voltage if the input voltage is less than $V_{REF}$. $V_{REF}$ is generally set to a voltage equal to the lowest acceptable battery voltage for reliable operation of the system. The outputs of comparators 42, 44, labeled 52 and 54 respectively, form the inputs to an AND logic gate 46. If both voltage comparators produce a high logic voltage, the output of the AND gate 56 will be a high logic level, but if either or both comparators output a low logic voltage, the AND gate will output a low logic voltage. The logic gate 46 controls the LED flasher 48. If the gate output 56 is high, the LED flasher 48 will periodically cause LED 50 to flash, but if the gate output 56 is low, the LED will remain extinguished.

Thus, flashing of LED 50 indicates that the system has two healthy batteries, while the absence of flashing indicates at best, that there is no reserve cell and at worst, that both cells are discharged. When LED 50 fails to flash, both batteries 30, 32 should be replaced. LED 50 is preferably bright enough to be clearly visible even in bright sunlight. Additionally, voltage comparators 42, 44 preferably employ hysteresis to prevent cycling the LED circuit when a battery voltage is teetering at $V_{REF}$.

The power for the flashing circuit 48 and LED 50 is provided solely by the predictive cell 30. Diode 36 blocks main cell 32 from supplying these components. Thus, if there is no load on the supply bus A because switch 34 is open, the predictive cell 30 will discharge faster than the main cell 32. If both batteries 30, 32 are identical when they are placed in the circuit, the predictive cell 30 will become depleted before the main cell 32 in normal circumstances.

The circuit described herein and shown in FIG. 5 may be used in any critical application requiring a redundant battery supply or a battery "health" or voltage indicator. When used with a seismic cable retriever, the switch 34 is a pressure switch for sensing seawater pressure and load 38 is a gas canister seal detonator. The two battery cells, 30 and 32, are preferably lithium 3.0 volt 1500 milliampere-hour cells such as Sanyo P/N 17335E-R. The diode 36 is preferably a 1N4004, and both comparators are preferably Panasonic MN1382J. The AND gate 46 may be implemented using discrete transistors. If the flasher circuit 48 is designed to flash LED 50 every three seconds, the LED and flasher will draw approximately 30 microwatts of power. With this arrangement, the predictive cell 30 will have a depletion rate of seven percent per year and will typically be able to flash the LED for ten years; the main cell 32 should retrain sufficient energy to activate the retriever for a considerably longer time than ten years. If the main cell 32 prematurely fails, the predictive cell 30 should be able to redundantly activate the retriever for up to the first nine of the ten years.

Figure 6:
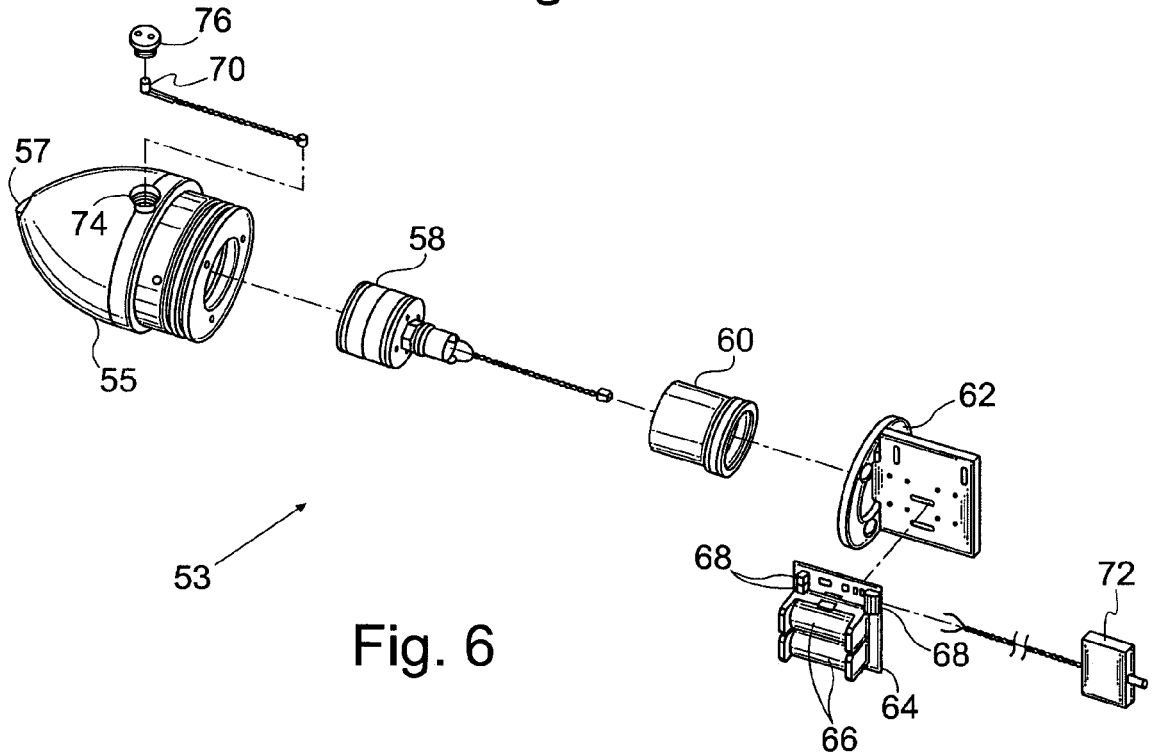
FIG. 6 is an exploded view of a tail piece of a retriever housing the dual battery and monitoring circuit according to the invention.

FIG. 6 is an exploded view of a tailpiece assembly 53 showing all of the components according to the invention when used in a cable retriever. The assembly 53 includes a tailpiece 55 which mates with the cable retriever housing, forming a watertight seal. The tailpiece includes an orifice 57 which allows seawater to come into contact with a pressure switch 58. Pressure switch 58 forms a watertight seal against internal surfaces of tailpiece 55, thus preventing water ingress into the retriever past the pressure switch 58. A collar 60 is used to secure pressure switch 58 to tailpiece 55. A bracket 62, which is designed and arranged to receive a printed circuit board 64, is fastened to tailpiece 55.

The printed circuit board 64 of FIG. 6 carries the two battery cells 66, the diode 36, the comparators 42, 44, the AND gate 46, and the flasher circuit 48. The board 64 also includes connectors 68 for coupling an LED 70, a pressure switch 58 and a detonator 72, which are located off-board.

LED 70 is positioned inside a cavity 74 in tailpiece 55. A transparent light conduit 76 fits into the cavity adjacent to LED 70 and forms a watertight seal with tailpiece 55. The light pipe 76 allows LED 70 to be easily viewed from the outside of the retriever without breaking the watertight seal.

While the preferred embodiment of the invention has been illustrated in detail, modifications and adaptations of the preferred embodiment will occur to those skilled in the art. Such modifications and adaptations are in the spirit and scope of the invention as set forth in the following claims:

What is claimed is:

1. A power supply circuit comprising,
   a main battery (32) having a main battery positive terminal (32B) connected to a bus (A), said main battery (32) supplying power only to a load (38),
   a predictive battery (30), independent of said main battery (32), having a predictive battery positive terminal (30B),
   a battery monitor circuit (100) characterized by a reference voltage lead, a first input lead connected to said predictive battery positive terminal (30B), a second input lead connected to said main battery positive terminal (32B), and an output lead, and
   a light (50) connected to said output lead of said monitor circuit (100), with said battery monitor circuit (100) arranged and designed to cause said light (50) to illuminate only when respective voltage of both said main battery positive terminal (32B) and said predictive battery positive terminal (30B) are greater than a reference voltage of said reference voltage lead, said light (50) coupled to and receiving power only from said predictive battery (30).

2. The power supply of claim 1 wherein,
   said battery monitor circuit (100) includes
   a first voltage comparator (44) having a first input lead connected to said bus (A) and a second input lead coupled to said voltage reference via said reference voltage lead,
   a second voltage comparator (42) having a first input lead connected to said predictive battery positive terminal (30B) and a second input lead coupled to said voltage reference via said reference voltage lead, and
   an AND gate (46) having a first input lead coupled to an output (54) of said first comparator (44) and a second input lead coupled to an output (52) of said second comparator (42), and
   an output (56), and
   a flasher (48) coupled to said output (56) and said light (50) and designed and arranged to periodically flash said light (50), said flasher (48) and said light (50) receiving power only from said predictive battery (30).

3. The power supply of claim 1 wherein,
   said light (50) is a light-emitting diode.

4. The power supply of claim 1 wherein,
   said load (38) is coupled to said bus (A) by a switch (34).

5. The power supply of claim 1 further comprising,
   a diode (36) having an anode (36A) connected to said predictive battery positive terminal (30B) and a cathode (36B) connected to said main battery positive terminal (32B).

6. The power supply of claim 1 wherein,
   said main battery (32) and said predictive battery (30) are substantially identical.

7. A retriever comprising,
   a supply of compressed gas (16),
   an inflatable bag (18) fluidly coupled to said supply,
   a device (38) designed to release said supply of compressed gas into said inflatable bag when electrically energized,
   a main battery cell (32) coupled to said device by a pressure switch (34), said main battery (32) supplying power only to said device (38),
   a predictive battery cell (30), independent of said main battery (32),
   a battery monitor circuit (100) coupled to said main battery cell (32) and said predictive battery cell (30) and having a light (50/70) which illuminates when said main battery cell and said predictive battery cell have voltages greater than a predetermined voltage, said light (50/70) receiving power only from said predictive battery (30).

8. The retriever of claim 7 wherein said battery monitor circuit (100) includes:
   a first voltage comparator (44) having a first input lead connected to said main battery cell (32) and a second input lead coupled to a reference voltage,
   a second voltage comparator (42) having a first input lead connected to said predictive battery cell (30) and a second input lead coupled to said reference voltage, and
   an AND gate (46) having a first input lead coupled to an output (54) of said first comparator (44) and a second input lead coupled to an output (52) of said second comparator (42), wherein,
   an output (56) of said AND gate (46) controls said light (50/70).

9. The retriever of claim 7 wherein said battery monitor circuit (100) includes:
   a flasher (48) coupled to said AND gate (46) and said light (50) and designed and arranged to periodically illuminate said light (50/70), said flasher (48) and said light (50/70) receiving power only from said predictive battery (30).

10. The retriever of claim 7 further comprising,
    a diode (36) having a cathode (36B) connected to a positive terminal (32B) of said main battery cell (32) and an anode (36A) connected to a positive terminal (30B) of said predictive battery cell (30),
    said diode (36) being arranged and designed to conduct only when voltage of said main battery cell (32) decreases by a predetermined amount below voltage of said predictive battery cell (30).

11. The retriever of claim 7 wherein,
    said light (50/70) is a light-emitting diode.

12. The retriever of claim 7 wherein,
said main battery cell (32) is substantially identical to said predictive battery cell (30).

13. The retriever of claim 7 further including,
an aperture (74) in said retriever, with said light (50/70) disposed in said aperture (74), and
a transparent light conduit (76) sealingly disposed in said aperture (74), wherein said light (50/70) is visible from the exterior of said retriever.

14. A method for powering an electric circuit comprising the steps of:
coupling a main battery (32) having a main battery voltage to said circuit, said main battery (32) supplying power only to a load (38),
coupling a predictive battery (30), independent of said main battery (32), having a predictive battery voltage to said circuit,
comparing the main battery voltage to a voltage reference,
comparing the predictive battery voltage to said voltage reference, and
illuminating a light (50/70) only with power supplied by said predictive battery (30) and only if the main battery voltage and the predictive battery voltage are both greater than the voltage reference.

15. The method of claim 14 further comprising the step of:
positioning said light (50/70) and said electric circuit in a marine seismic cable retriever (53).

16. The method of claim 15 further comprising the steps of:
disposing said light (50/70) in an aperture (74) in the exterior of said retriever (53), and
sealing said light (50/70) in said aperture (74) with a transparent light conduit (76), so that said light (50/70) is visible from said exterior of said retriever (53).

17. The method of claim 14 further comprising the step of:
coupling said predictive battery (30) to said main battery (32) with a diode (36), such that a cathode (36B) of said diode (36) is connected to a positive terminal (32B) of said main battery (32) and an anode (36A) of said diode (36) is connected to a positive terminal (30B) of said predictive battery (30).

18. The method of claim 17 wherein,
said diode (36) only conducts when said main battery voltage decreases by a predetermined amount below said predictive battery voltage.

19. The power supply of claim 2 wherein,
said load (38) is coupled to said bus (A) by a switch (34).

20. The power supply of claim 2 further comprising,
a diode (36) having an anode (36A) connected to said predictive battery positive terminal (30B) and a cathode (36B) connected to said main battery positive terminal (32B).

21. The power supply of claim 20 wherein,
said diode (36) being arranged and designed to conduct only when voltage of said main battery positive terminal (32B) decreases by a predetermined amount below voltage of said predictive battery positive terminal (30B).

22. The power supply of claim 5 wherein,
said diode (36) being arranged and designed to conduct only when voltage of said main battery positive terminal (32B) decreases by a predetermined amount below voltage of said predictive battery positive terminal (30B).

23. The retriever of claim 9 further comprising,
a diode (36) having a cathode (36B) connected to a positive terminal (32B) of said main battery cell (32) and an anode (36A) connected to a positive terminal (30B) of said predictive battery cell (30),
said diode (36) being arranged and designed to conduct only when voltage of said main battery cell (32) decreases by a predetermined amount below voltage of said predictive battery cell (30).

* * * * *